United States Patent [19]
Chiu et al.

[11] Patent Number: 6,009,534
[45] Date of Patent: Dec. 28, 1999

[54] FRACTIONAL PHASE INTERPOLATION OF RING OSCILLATOR FOR HIGH RESOLUTION PRE-COMPENSATION

[75] Inventors: Kar-Shing Chiu; Ming-Tak Leung, both of Sunnyvale, Calif.

[73] Assignee: Texas Instruments Incorporated, Dallas, Tex.

[21] Appl. No.: 09/088,551

[22] Filed: Jun. 1, 1998

[51] Int. Cl.[6] ..................................................... G06F 1/00
[52] U.S. Cl. ..................................... 713/503; 331/107 R
[58] Field of Search ..................... 713/503; 331/107 R, 331/108 B, 135; 365/189.01, 189.09

[56] References Cited

U.S. PATENT DOCUMENTS

| | | | |
|---|---|---|---|
| 3,911,368 | 10/1975 | Tarczy-Hornoch | 327/237 |
| 5,594,675 | 1/1997 | Peng | 708/313 |
| 5,644,514 | 7/1997 | Abo et al. | 702/124 |

*Primary Examiner*—Thomas M. Heckler
*Attorney, Agent, or Firm*—W. Daniel Swayze, Jr.; Wade James Brady, III; Richard L. Donaldson

[57] ABSTRACT

The present invention includes a fractional interpretation circuit to be used to correct pre-write compensation for writing data on a disk. The present invention need not be limited to a three phase interpreter but could easily be extended to a 4X or 5X. This could simply be implemented by adding additional current paths from the capacitors to ground in order to incrementally change the slew rate and consequently the phase interpretation.

13 Claims, 8 Drawing Sheets

— PHASEA
- - RAMPA

— PHASEB
- - - RAMPB

▭ NON-LINEAR REGION
—¹— RAMPA+RAMPA
—²— RAMPA+RAMPB
-³- RAMPB+RAMPB

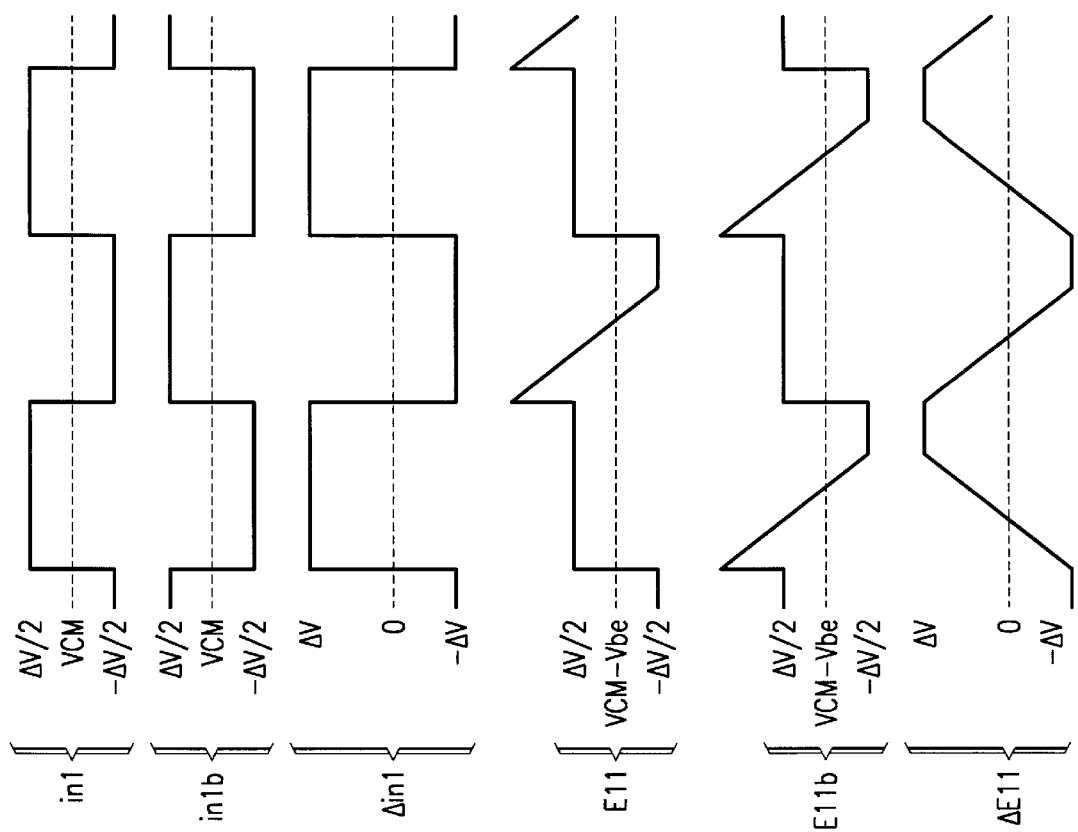
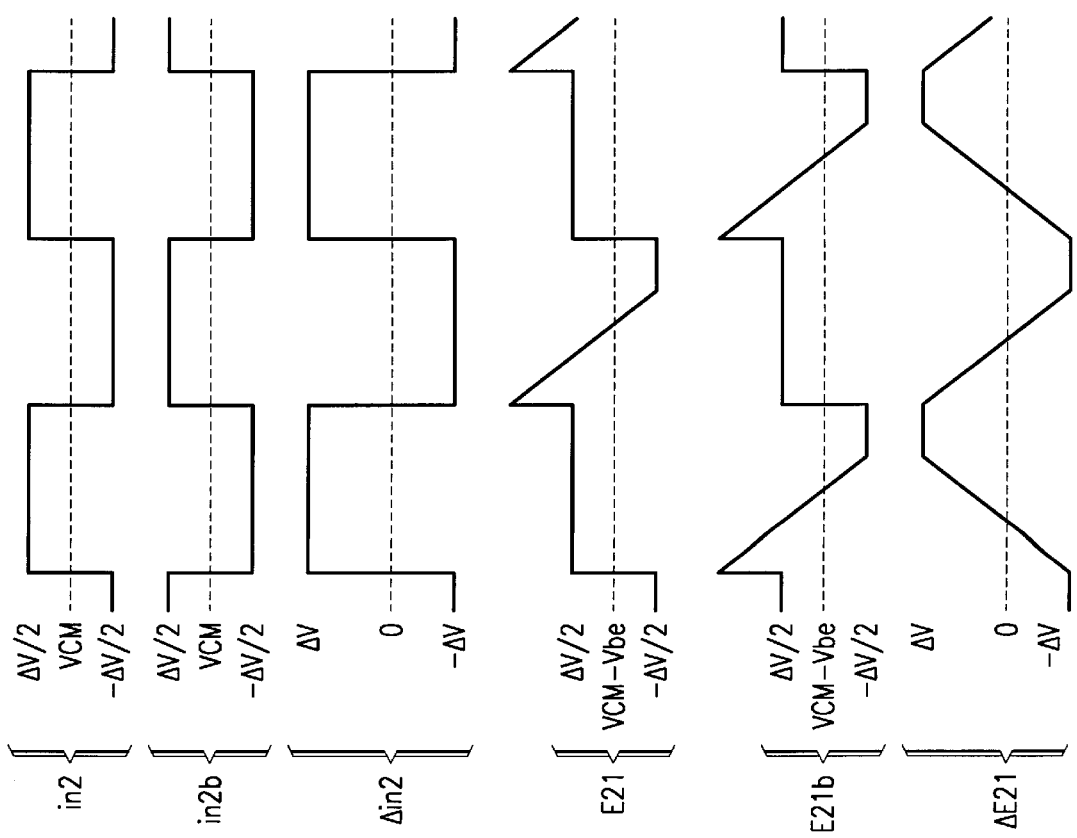

FRACTIONAL PHASE INTERPOLATION OF RING OSCILLATOR FOR HIGH RESOLUTION PRE-COMPENSATION

FIELD OF INVENTION

The invention relates to the field of integrated circuitry for writing data to a magnetic medium and more particularly to techniques for generating a precompensation delay in the path of a write data stream.

BACKGROUND OF THE INVENTION

In computer systems, information is stored on magnetic storage systems such as Winchester type hard disks or floppy disks. Data is stored in a series of spiral or concentric rings known as "tracks". The data consists of transitions of polarity of magnetic particles on the disk surface. A number of schemes are used to detect these transitions and data.

One prior art, data detection method is a peak detection system. A disadvantage of peak detection scheme's is limited to data density. Another prior art scheme, as known as partial response class IV (PR-IV) signaling. Systems using these PR-IV schemes can achieve higher density recording than conventional peak detection systems.

A PRML (partial-response maximum likelihood) channel can be used to achieve high data density in writing and reading digital data of pulses on the disks.

PRML coding assumes a lineal channel. However, the recording characteristics of the magnetic medium such as a disk are non-linear due to non-linear magnetic effects such as, partial erasure.

Non-linear distortion in the channel and consequently in the recording process on the magnetic medium leads to degradation at higher density and data rates. Narrow pulses in certain patterns digital data signals experience pulse compression and other non-linear pulse-edge displacement effects when stored magnetically on a disk file. This results in pattern dependent, edge shifts of the transition. The resulting data when read back from the disk has a higher error rate because of non-linear edge timing shifts of the pulses which reduce the timing margin for error of the data detection system. If the pattern-dependent edge shifts of the pulses can be ascertained for a particular medium, then it is possible to preshift the data write pulses edges by the amount equal and opposite to the direction which the medium will shift them to eliminate the pattern dependent, edge shifts. As a result, data is written on the magnetic medium with a correct timing relationship read back from the disk. Timing precompensation solves the problem of pattern dependent, edge shifts and decreases error rates when the data is read back for accuracy and increases the disk file capability. Particular algorithms for determining which pulse edge to shift are well known and not described in detail. The amount of capacity improvement attainable for any algorithm depends on the accuracy of the time shifts delivered by the precompensation circuit.

User files are stored along these concentric tracks defined in magneticable surface coding on the surface of the rotating disk. To this end, during storage of the user file, user data is encoded and bits of encoded file are serially clock to the write head driver that passes an electronic current through a write head which is adjacent to a selected disk surface to magnetize segments of the select data track in a pattern that reflects the sequence of logical values of bits that include the encoded user file. These magnetized segments, in turn, produce a magnetic field that can be sensed by read head during reading to generate a sequence of electrical pulses that reflects the pattern of magnetization of the data track to prevent the recovery of the encoded file for decoding and one returned to the computer which makes use of the hard disk drive for another user file.

As described, write precompensation is a technique associated with the minimization or removal of the effects of non-linear transitional shift (NLTS) that can occur in high density magnetic recording. Non-linear transition shift is a write effect caused by magneto-static interactions that occur between closely spaced magnetic transitions. When adjacent magnetic transitions are recorded close together, NLTS causes a transition that immediately follows a preceding transition to be shifted or drawn towards the preceding transition such that the spacing is altered from the ideal. When incorrect NLTS causes degradation of overall recording performance.

As magnetic recording densities become greater and greater, write precompensation techniques have become increasingly important to compensation for the detrimental effects of NLTS. Write precompensation involves delays in time at which adjacently recorded transitions are written into a magnetic medium so that adjacent transitions are recorded where intended, for example in proper bit spacing on the medium relative to the write clocking signal. A write precompensation "looks" at user data stream as it is written to the disk and detects the situation where two or more situations are transitions immediately follow each other without sufficient intervening bit times. The write precompensation circuit is able to adjust the relative delay (or phase with respective to the write clock) of the transition following a preceding transition in order to carry out the necessary precompensation relative to the write clock signal.

Application of precompensation delay causes the effected transitions to be time delayed by the appropriate amount, often expressed as a percentage of nominal bit cell period or a percentage of delay established by the write clock signal. With the emergence of PRML systems in magnetic systems, non-linear transition shift and write compensation has become of a particular concern.

A problem with previous precompensation write circuits is that the amount of time that the affected transition is delayed is insufficient.

Typically, the data to be written and the corresponding transitions to be written are synchronized to a time based generator (TBG) in the recording channel. This clock is used to write data onto the recording medium.

As described above, precompensation is accomplished by altering the actual position of the data transitions that are recorded onto the storage medium. In order to accomplish precompensation, a plurality of clock phases are used to alter the actual positions of the data transitions. Typically, a ring oscillator including a voltage controlled oscillator is employed. With a ring oscillator VCO, multiple phases are available for output by using the output of different delay stages in the ring oscillator. However, a problem with the ring oscillator is the number of stages used in the ring oscillator. The number of phases is limited to twice the number of stages in the ring oscillator. For example, if the ring oscillator has ten stages, then there is only 20 phases that are obtainable from the output. Consequently, the resolution is limited to 5% (resolution=½× number of stages in the ring oscillator). FIG. 1 illustrates a ten stage ring oscillator connected to a ten-to-two phase multiplexer with a precompensation phase select. The output of the ten-to-two phase multiplexer is output to a two X phase interpolation circuit. This system described in FIG. 1 operates satisfactory if the data rate of operation is not too high. As the data rate increases, problems result with the ten stage ring oscillator in terms of power dissipation. For 325 Mbps, operation, the ten stage ring oscillator will be running at 345.5 Mhz. This requires a large amount of power. The frequency linearity and the gain of the VCO will be a problem at this high data rate. This causes a speed bottle neck in the phase lock loop (PLL) which is typically used in a channel.

Additionally, frequency linearity will suffer because each delay stage in the ring oscillator has a fixed gate delay $T_{fixed}$ and a variable delay $T_{ADJ}$ depending on the $V_{ADJ}$ control voltage from the PLL filter. The total delay from a single delay stage is illustrated in Equation 1.

$$T_{fixed}+T_{adj}=T_{delay} \quad \text{Equation 1}$$

For each clock cycle, the signal is required to go through all the delay stages twice. Thus, the clock period of the oscillator output $T_{vco}$ is illustrated in Equation 2.

$$T_{vco}=20T_{delay}=20(T_{fixed}+T_{adj})=20T_{adj}+T_{Constant} \quad \text{Equation 2}$$

where $T_{Constant}=20T_{fixed}$.

Ideally, the oscillator should be linear. More specifically, the relationship between the control voltage $V_{adj}$ and the oscillation frequency should be linear. To achieve this linearity, $T_{vco}$ should depend only on $V_{adj}$. Consequently, $T_{Constant}$ should be relatively small (and as small as possible) as compared to the 20 $T_{adj}$. At a low data rate (frequency), these constraints are satisfied, and the system operation is satisfactory. However, as the data rates increases, these assumptions are no longer valid and the system starts to demonstrate non-linearity relationships when $T_{Constant}$ approaches that of $T_{ADJ}$. As a result, the frequency linearity and the gain of the VCO will suffer. Thus, a design goal is to reduce the constant delay term $T_{Constant}$. Typically, the most straightforward ways achieve this result is to use less delay stages or to reduce $T_{fixed}$ of the delay stages as illustrated in Equation 3.

$$T_{Constant}=2n\times T_{fixed} \quad \text{Equation 3}$$

where n is the number of stages in the ring oscillator.

FIG. 2 illustrates the phase diagram of a 10 stage ring oscillator. The arrows 1200 illustrate the equally distant phase output of the ring oscillator.

This case no phase interpolation is employed, the precompensation resolution $P_{res}$ is only 5% since $P_{res}$ is defined as Equation 4.

$$P_{res}=(\tfrac{1}{2}n)\times 100\% \quad \text{Equation 4}$$

This provides insufficient precompensation for high data rates. Typically, at the very least, the precompensation resolution should be below 3%. As illustrated in FIG. 3, a 2X phase interpolation provides a resolution of 2.5%. FIG. 3 illustrates element 1300 being the phase output from the 10 stage ring oscillator while element 1302 illustrates the additional phases obtained from the 2X interpolation. As illustrated by FIG. 3, if fewer delay stages are employed, the resolution of pre-compensation will be increased. As discussed, this is too coarse for high rates.

FIG. 4 illustrates a 2X phase interpolation circuit. Each phase, namely phase A and phase B, are input to a ramp generator. This phase causes a ramp signal to be generated which are summed by a summation circuit. The results are threshold compared and the edge corresponding to the zero crossing point is output to the write precompensation clock.

Typically, the 2X interpolator circuit generates two ramps by two ramp generators namely, ramp A and ramp B from two adjacent phases. The phases are phase A and phase B output from the ring oscillator. Additionally, these two ramp generators have identical gain and slew rate. The output from the ramp generators are illustrated in FIG. 5. The two ramps are summed and the summed result is illustrated as trace 2 (solid line). If only one single phase (either phase A or phase B) is input to the phase interpreter, as illustrated as trace 1 (ramp A+ramp A) or trace 3 (ramp B+ramp B) will be produced. The zero-crossing points of these three traces, as illustrated in FIG. 5 are separated from each other by ½ the phase difference between phase A and phase B with respect to trace 2 and the middle between trace 1 and trace 3. Thus, the zero-crossing points from the summation of the ramps provide the desired phase interpretation locations. The zero-crossing points are converted by a differential comparator (CMP) to a specific clock phase that can be used by precompensation circuit to write the data. However, this circuit suffers from the disadvantages described above namely, large power usage, unsuitability with high data rates and insufficient resolutions.

SUMMARY OF THE INVENTION

The circuit of the present invention triples the resolution of the phases. The circuit of the present invention is switchable to provide precompensation at high data rates. The circuit of the present invention uses little power. Furthermore, the present invention can be used with a six stage VCO, reducing the number of stages within the ring oscillator. Thus, any non-linear effects are caused by a summing amplifier and the ramp generator. Thus, this non-linearity effectively limits the phase difference between phase A and phase B, and consequently reduces the number of VCO stages. The present invention uses a ramp generator with a switchable gain or slew rate of either 2 or 1. Thus, the present invention can be used when the design requires a 2 phase interpolation or can be used in a more advanced circuit using a 3 phase interpolation. The present invention achieves the variable gain by increasing and decreasing current paths. The present invention achieves the variable gain by switching the slew rate of a programmable ramp generator to either a normalized value of 1 or 2. A plurality of ramp generations are switchable in this manner. This programmable slew rate is achieved by either using a single current path or two current paths thus using either 1X or 2X current to charge and discharge a capacitor. The present invention uses a logic circuit to activate these current paths. The present invention uses a 6 stage ring oscillator. The output of the ring oscillator is connected to a 6 to 2 phase multiplexer each of the phases are input to a switchable 3X phase interpolator, which is output to a write precompensation clock circuit.

BRIEF DESCRIPTION OF THE DRAWING

FIG. 11 illustrates a waveform diagram of a first ramp generator.

FIG. 12 illustrates a waveform diagram of a second ramp generator.

DETAILED DESCRIPTION OF THE INVENTION

Figure 1:
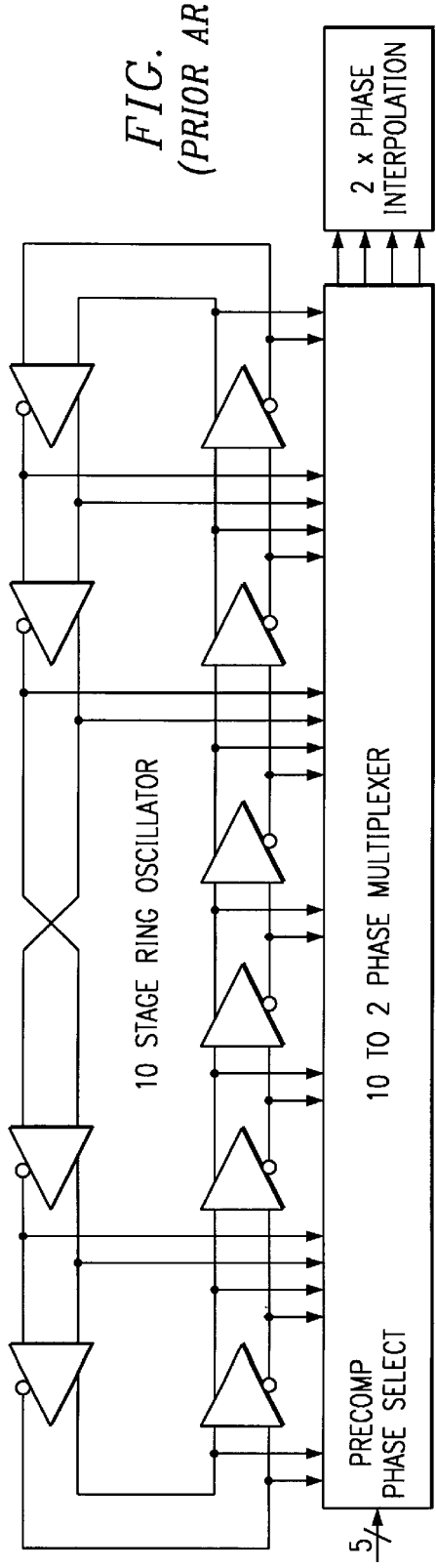
FIG. 1 illustrates a precompensation circuit with a 10 stage ring oscillator.
Figure 3:
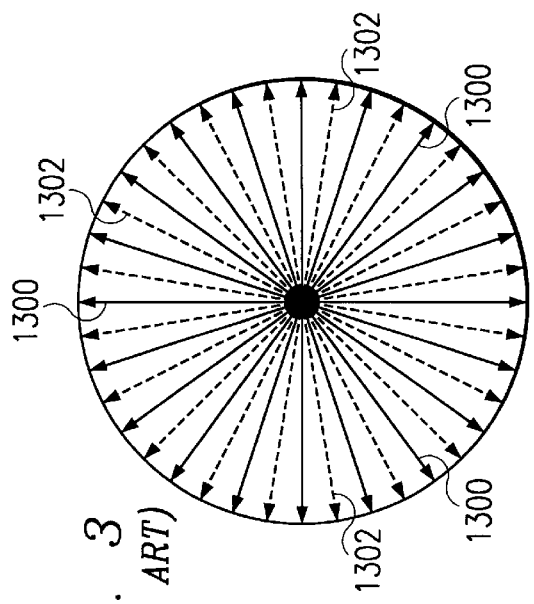
FIG. 3 illustrates a phase diagram for a 2X phase interpolation system with the 10 stage ring oscillator.
Figure 2:
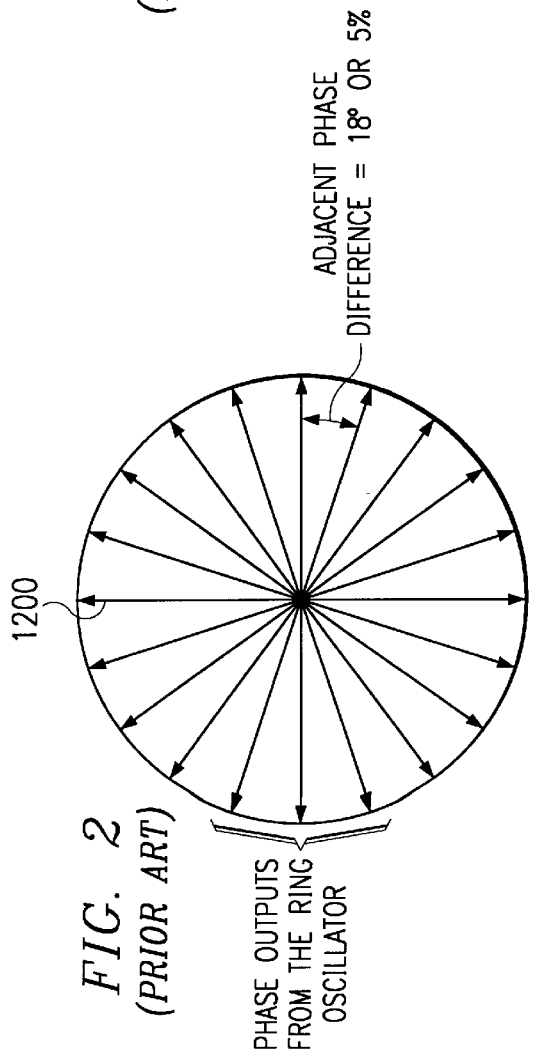
FIG. 2 illustrates a phase diagram of the 10 stage ring oscillator.
Figure 4:
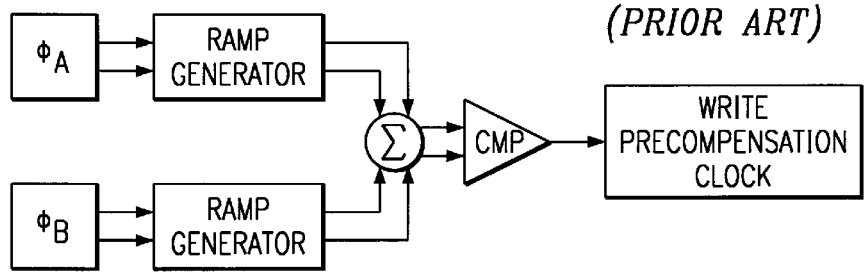
FIG. 4 illustrates a circuit diagram for the 2X phase interpolation circuit.
Figure 5:
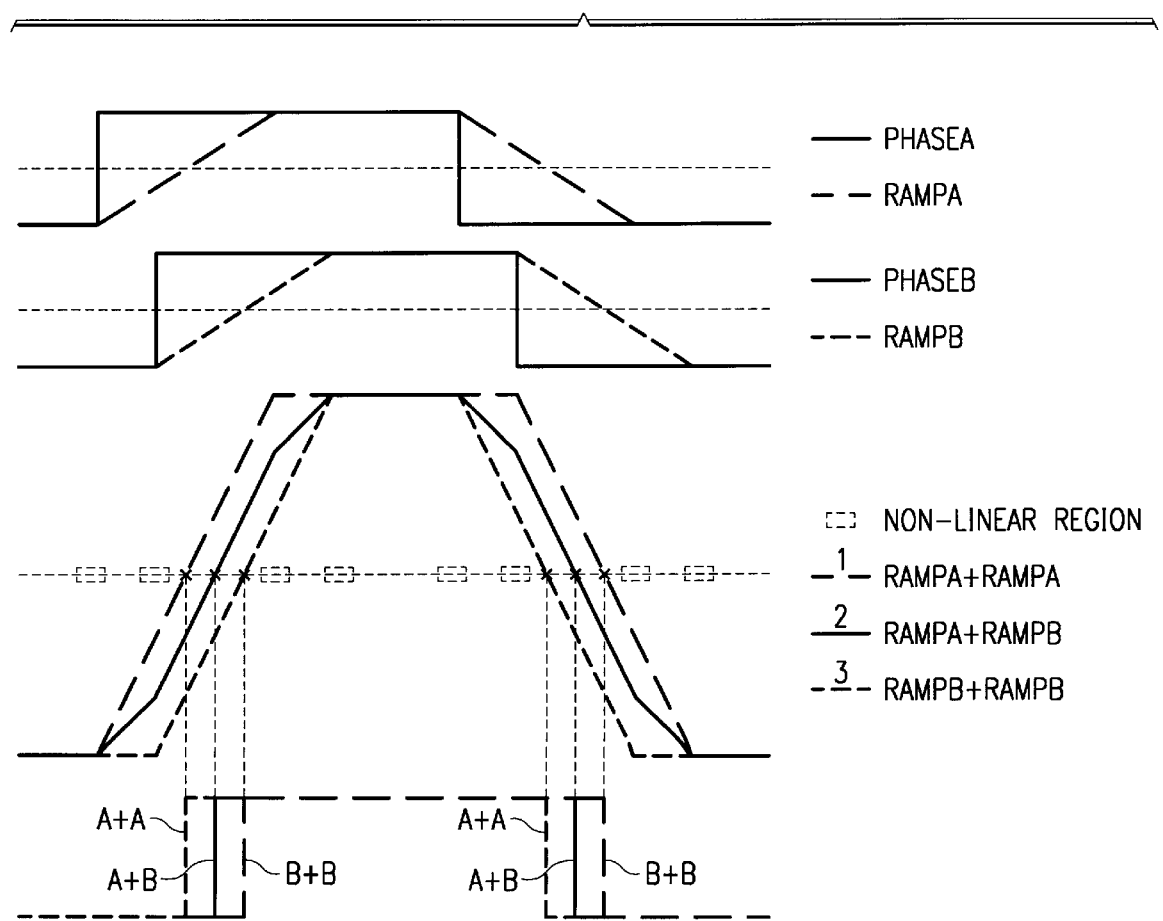
FIG. 5 illustrates a diagram of the output of the 2X phase interpolator.
Figure 6:
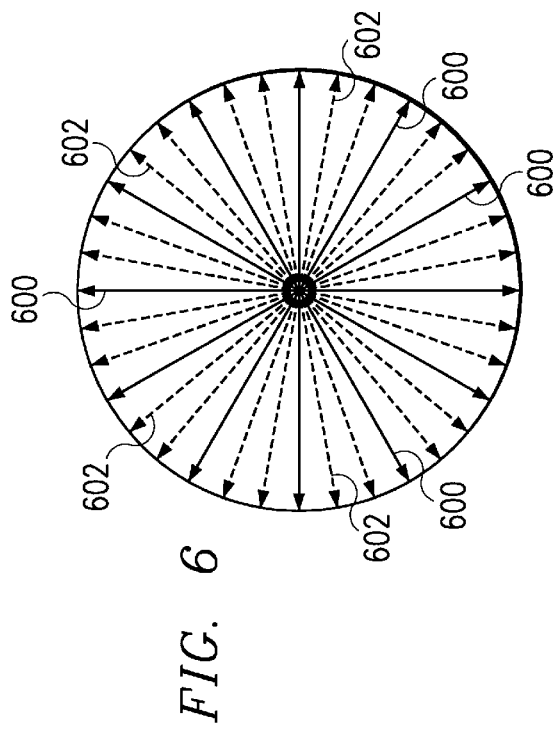
FIG. 6 illustrates the phase diagram of a precompensation circuit with a 6 stage ring oscillator and with 3X phase interpolation.
Figure 7:
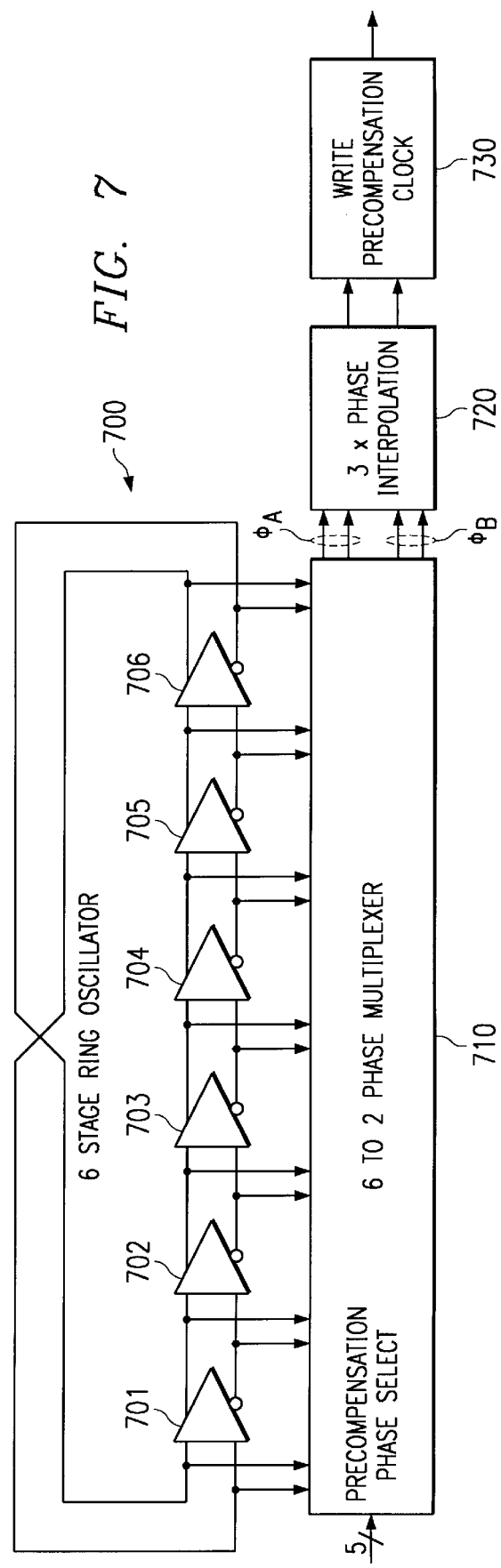
FIG. 7 illustrates a system diagram of the precompensation circuit with 3X phase interpolation circuit with the 6 stage ring oscillator.

FIG. 7 illustrates a system of the present invention. FIG. 7 illustrates a 6 stage ring oscillator 700. The 6 stage ring oscillator 700 includes six delay circuits namely, delay circuit 701, delay circuit 702, delay circuit 703, delay circuit 704, oscillator delay circuit 705 and delay circuit 706. Each of these delay circuit outputs a phase of the clock at specific oscillation frequency defined by the control voltage. Each signal corresponds to a phase delayed signal 600 as illustrated in FIG. 6. The multiplexer 710 selects the output from the ring oscillator 700 in accordance with the precompensation phase select signal input to the multiplexer 710. The multiplexer 710 outputs 2 differential clock phases signals to the 3X phase interpolator 720. The 3X phase interpolation circuit 720 outputs interpolation signals indicative of the amount of precompensation required. The interpolation signals are input to a write precompensation clock circuit 730 which outputs a clock signal from the write precompensation clock circuit 730 to provide an indication when the write signal should be written to magnetic disk as a write transition signal.

Figure 8:
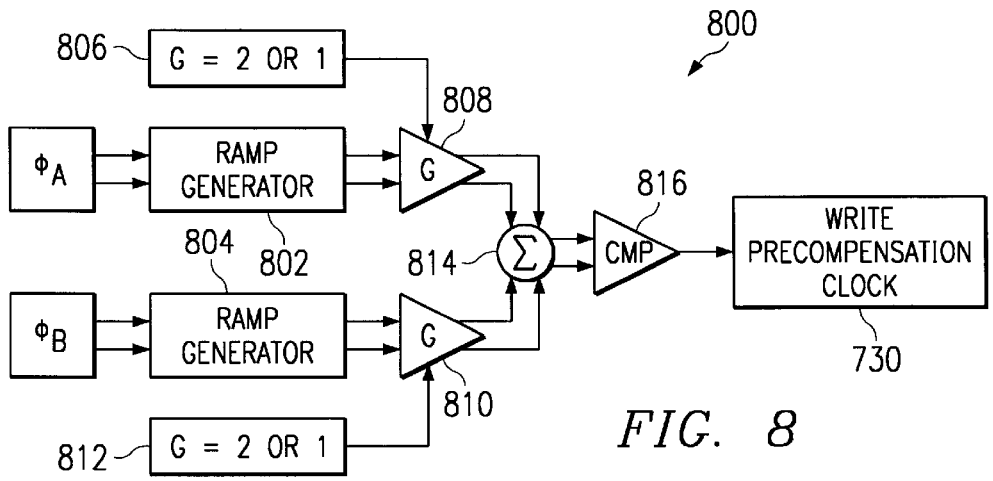
FIG. 8 illustrates a circuit diagram of the 3X phase interpolator circuit.

As illustrated in FIG. 8, the interpolation circuit 800 includes a first ramp generator 802 and a second ramp generator 804 to receive a first phase, phase A and a second phase, phase B. The slew rate of each of the first ramp generator 802 and the second ramp generator 804 is independently programmable. These phases again are at the same frequency but differ, of course, in phase. Additionally, the interpolator circuit 800 includes two amplifiers, namely a first amplifier 808, and a second amplifier 810. The first amplifier 808 receives the output from the first ramp generator circuit 802 and the second amplifier circuit 810 receives the output of second ramp generator 804. The output of the first amplifier 808 and the second amplifier 810 is input to a summing circuit 814 to sum the respective output of first amplifier 808 and the second amplifier of 810 together. The output of first amplifier 808 and the output of second amplifier 810 are typically a pair of differential signals which are summed together. The sum of the differential signals is output from the summing circuit 814 and input to a comparator 816. The comparator 816 converts the zero-crossing point to a clock edge that can be used for writing. This output is either a signal indicative of phase A or phase B or the two interpolated phase in between, as illustrated in FIG. 6. Additionally, the 3X phase interpolation circuit 800 includes a first selector circuit 806 and a second selector circuit 812. The first selector circuit 806 outputs a first select signal to amplifier 806 to control the gain of first amplifier 808 while the second selector circuit 812 outputs a second selector signal to amplifier 810 to control the gain of second amplifier.

Figure 10A:
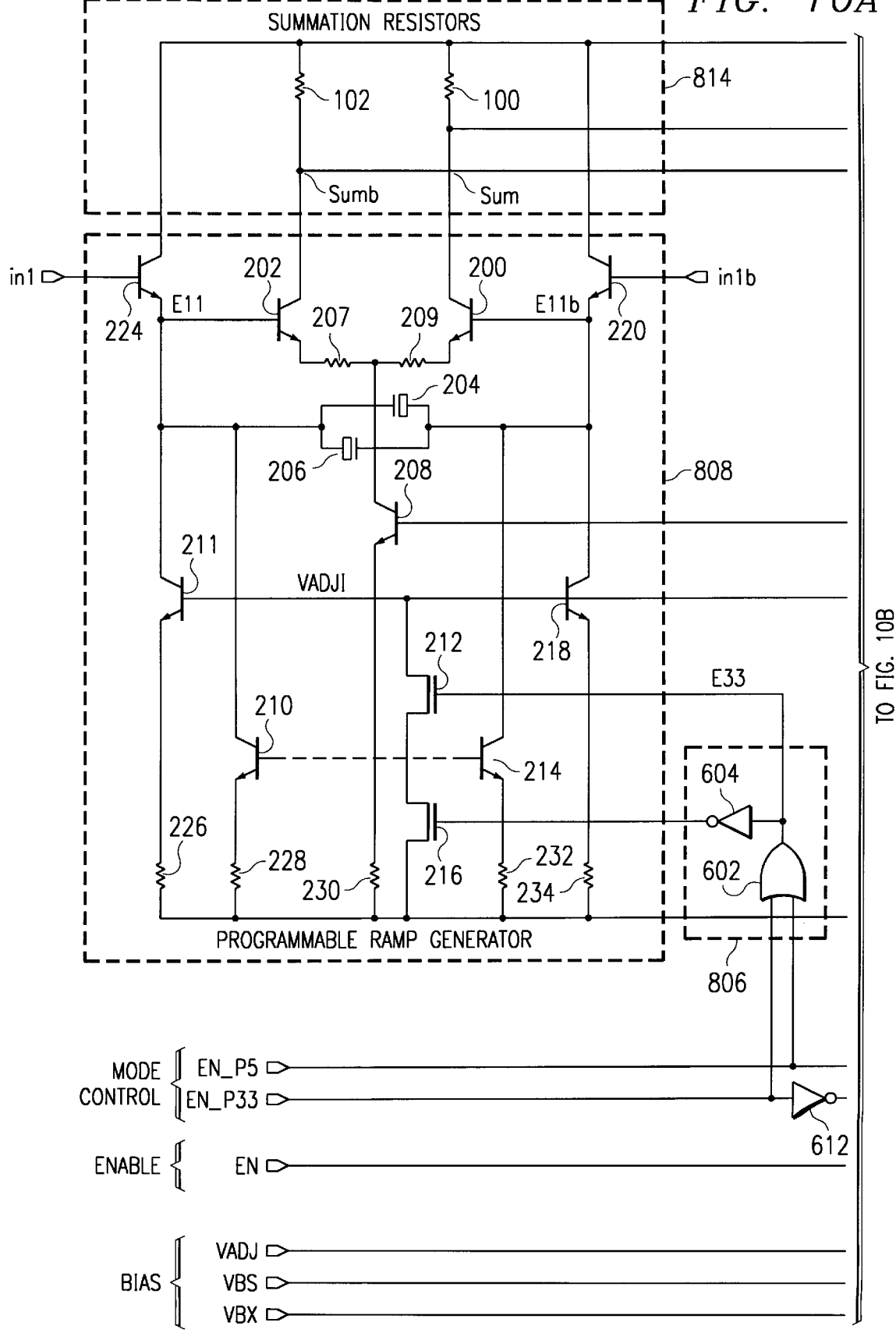
FIG. 10 illustrates a detailed circuit diagram of the 2 A+B phase interpolator (3X phase) circuit.
Figure 10B:
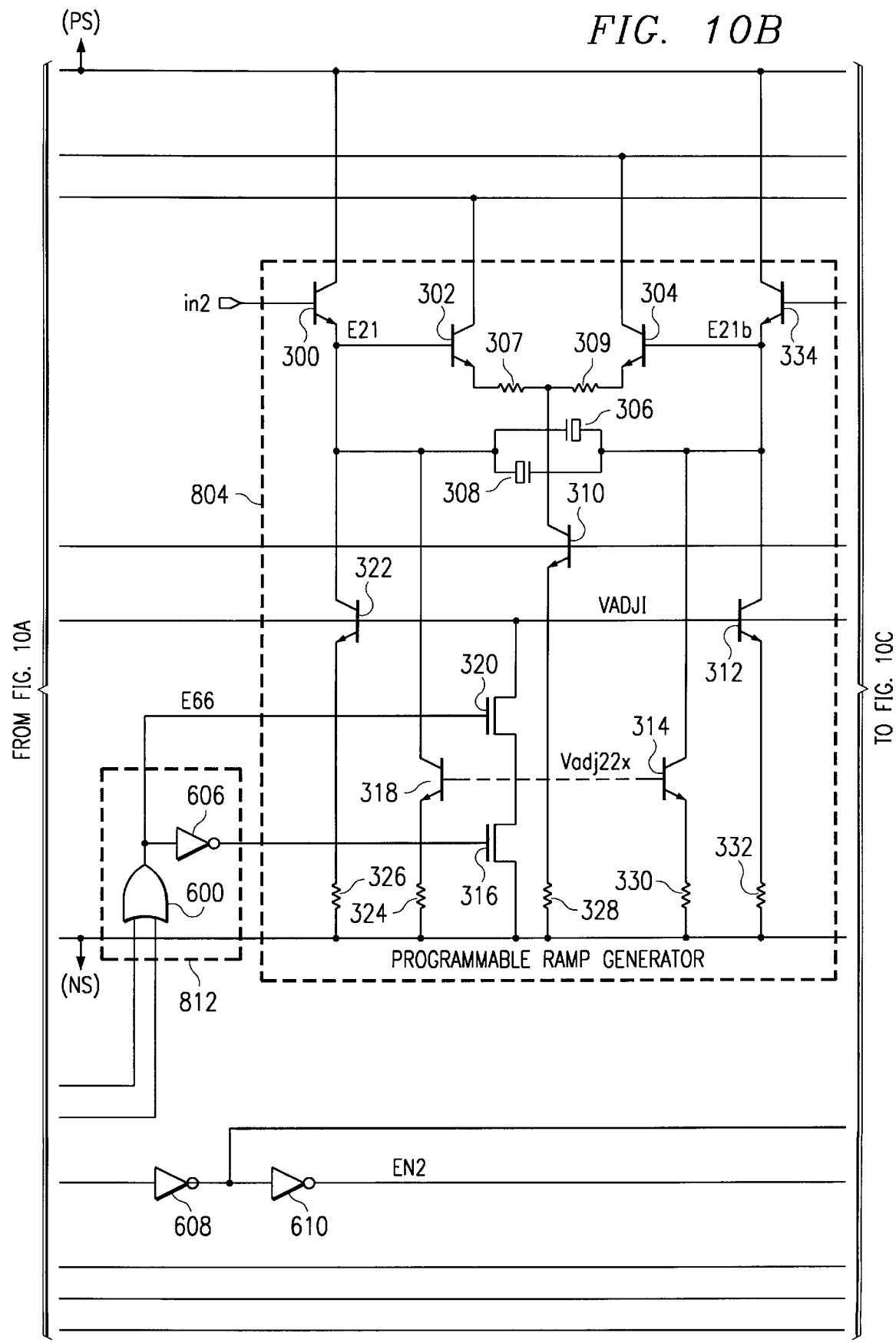
Figure 10C:
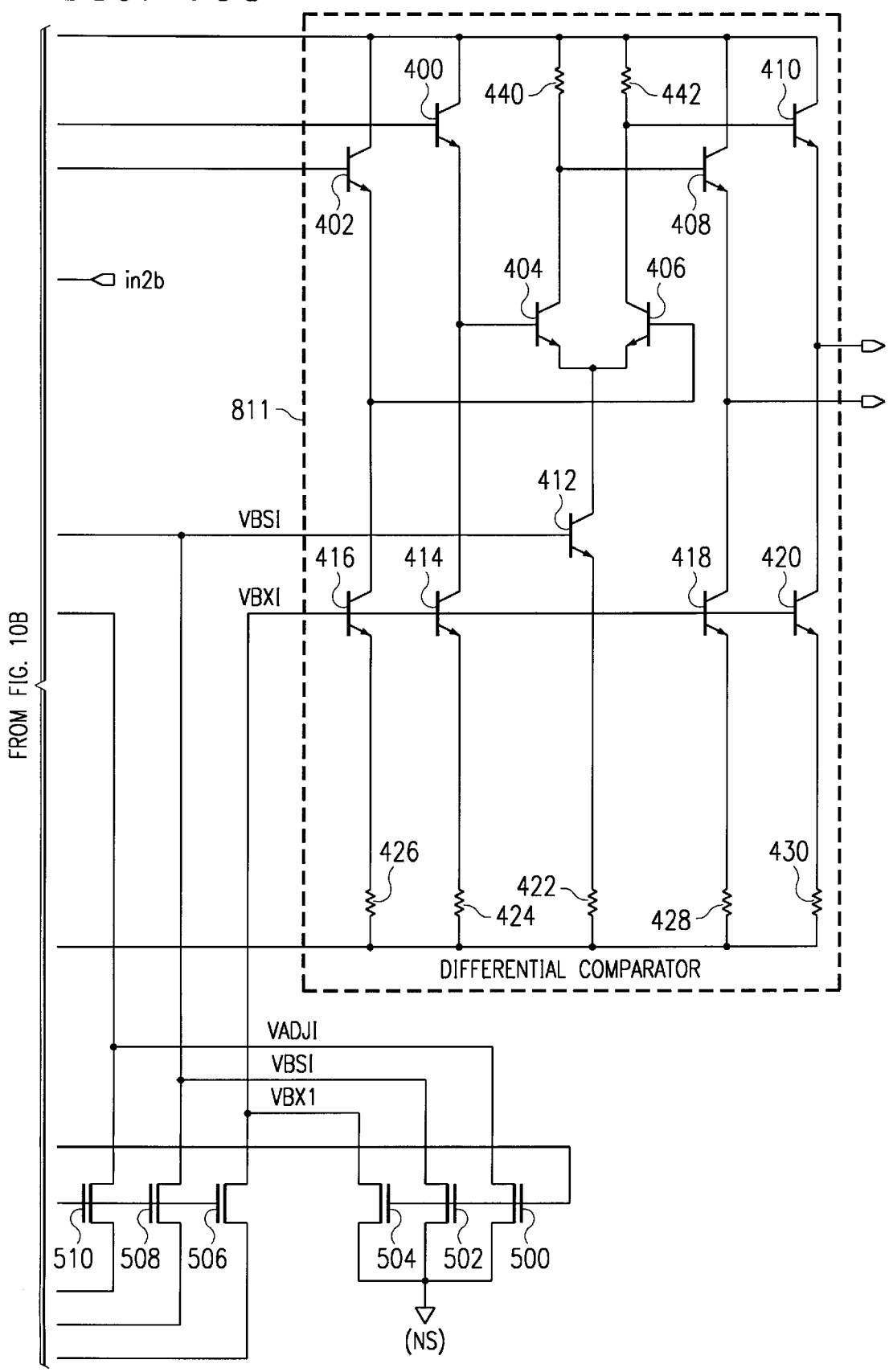

FIG. 10 illustrates a detailed circuit diagram of the summation circuit 814, the first programmable ramp generator 802 and the second programmable ramp generator 804. Furthermore, FIG. 10 illustrates the first gain selector circuit 806 and the second gain selector circuit 812. The second ramp generator includes FET 320 having a source connected to the drain of FET 316. The source of FET 316 is connected to ground. The drain of FET 320 is connected to the gate of transistor 322 and to the $V_{ADJI}$ line. The emitter of transistor 322 is connected to resistor 326 which is in turn connected to ground. The collector of transistor 322 is connected to the emitter of transistor 300. The base of transistor 300 is connected to a terminal 301 which receives an input in2 while the collector of transistor 300 is connected to the power supply. The base of transistor 302 is connected to the emitter of transistor 300 while the collector of 302 is connected to the resistor 102. The collector of transistor 304 is connected to the resistor 100 while the emitter of transistor 302 are connected through a pair of resistors 307 and 309 to the emitter of transistor 304. The base of transistor 304 is connected to the emitter of transistor 334 while the base of transistor 334 is connected to the terminal 335 to receive the signal input in2B. The collector of transistor 334 is connected to the power supply. A pair of capacitors 308 and 306 are connected in parallel and each of these capacitors 306 and 308 are connected to the emitter of transistor 300 and another end of the capacitors are connected to the emitter of 334. The collector of transistor 310 is connected between the two resistors 307 and 309 while the emitter of transistor 310 is connected to resistor 328. The bases of transistors 318 and 314 are coupled together and to the source of FET 320 and drain of FET 316. The collector of transistor 318 is connected to capacitors 306 and 308 and the collector of transistor of 314 is coupled to the other end of capacitors 306 and 308. The emitter of transistor 314 is connected to resistor 330 which is connected to ground. The base of transistor 312 is connected to the base of transistor 322 to the $V_{ANI}$ line. The collector of transistor 312 is connected to the emitter of transistor 334 while the emitter of transistor 312 is connected to resistor 332 which is connected ground.

The first ramp generator 808 is constructed in a similar fashion. The drain of FET 212 is connected to the $V_{ADJI}$ line. The source of FET 212 is connected to the drain of FET 216 while the source of FET 216 is connected to ground. The gate of FET 212 is connected to the OR gate 602. The gate of FET 216 is connected to inverter 604. The collector of transistor 218 is connected to the emitter of transistor 220 and to the base of transistor 200 while the collector of transistor 220 is connected to the power supply. Likewise, the collector of transistor 211 is connected to the emitter of transistor 224 and to the base of transistor 202 while the collector of transistor 224 is connected to the power supply. The base of transistor 224 is connected to terminal 201 to receive an input In1. The base of transistor 220 is connected to terminal 235 to receive an input In1b. The emitter of transistor 224 is connected to the base of transistor 202, and the collector of transistor 202 is connected to resistor 102 of summation resistors 814. The emitter of transistor 202 is connected to a resistor 207 which is in turn connected to a second resistor 209 which is connected to the emitter of transistor 200. The collector of transistor 200 is connected to resistor 100. The base of transistor 200 is connected to the emitter of transistor 220. Capacitors 204 and 206 are connected in parallel. One end of the parallel connection of capacitors 204 and 206 are connected to the collector of transistor 211 and connected to the collector of transistor 210. The emitter of transistor 211 is connected a resistor 226.

The other end of resistor 226 is connected to ground. The collector of transistor 208 is connected between two resistors 207 and 209, and the emitter of transistor 208 is connected to resistor 230 and resistor 230 is connected to ground. The emitter of transistor 214 is connected to resistor 232 which is connected to ground. Additionally, the emitter of transistor 218 is connected to resistor 234; the other end of resistor 234 is connected ground. The select circuit 806 includes an OR gate 602 to output signal E33. The output of OR gate 602 is connected to the gate of FET 212 and the output of OR gate 602 is connected to the input of inverter circuit 604 which is connected to the gate of FET 216. The select circuit 812 includes an OR gate 600. The output of OR gate 600 is connected to the gate of FET 320, and the output of OR gate 600 is connected to the input of inverter 606. The output of inverter 606 is connected to FET gate 316.

The differential comparator 816 includes transistor 402 to receive the output from the summation resistor circuit 814 and is connected to resistor 102. Transistor 400 has its base connected to the summation resistors 814 between resistor 100 and the collector of transistor 200. The collector of transistor 402 is connected to the power supply while the emitter of transistor 402 is connected to the collector of transistor 416. The emitter of transistor 416 is connected to resistor 426 while the other end of resistor 426 is connected to ground. The collector of transistor 400 is connected to the power supply while the emitter of transistor 400 is connected to the collector of transition 414. The emitter of transistor 414 is connected to resistor 424 while the other end of resistor 424 is connected to ground. The emitter of transistor 404 is connected to the emitter of transistor 406. The emitter of transistor 400 is connected to the base of transistor 404. The collector of transistor 404 is connected to resistor 440. The other end of resistor 440 is connected to the power supply. The collector of transistor 406 is connected to resistor 442 with the other end of resistor 442 being connected to the power supply. The emitter of transistor 404 is connected to the emitter of transistor 406. Both these emitters are connected to the collector of transistor 412. The emitter of transistor 412 is connected to a resistor 422 with the other end of the resistor 422 being connected to ground. The base of transistor 412 is connected to the internal bias line $V_{BSI}$. The collector of transistor 404 is connected to the base of transistor 408. The collector of transistor 406 is connected to the base of transistor 410. The collector of transistor 408 is connected to the power supply while the emitter of transistor 408 is connected to the collector of transistor 418. The emitter of transistor of 418 is connected to resistor 428 with the other end of the resistor connected to ground. The emitter of transistor 410 is connected to the collector of transistor 420. The emitter of transistor 420 is connected to resistor 430 with the other end of resistor 430 being connected to ground. The base of transistor 420 is connected to the base of transistor 418 which is in turn connected to the base of transistor 414 and the base of transistor 416 to the internal bias line $V_{BXI}$.

In operation, the ENABLE signal EN is input to inverter 608 and is input to inverter 610. These signals activate the bias lines $V_{ADJI}$, $V_{ASI}$, and $V_{BXI}$ by turning on FETS 590, 508 and 504, and turning off FETS 500, 502, and 504. This enables the first ramp generator 804, the second ramp generator 808 and the comparator 816. Additionally, there are two mode control signals, an EN_P5 signal is input to OR circuit 600 and OR circuit 602. Additionally, a control EN_P33 signal is input to the OR circuit 600 and to inverter circuit 612. The output of inverter circuit 612 is input to OR circuit 600. When the OR circuit outputs a high signal, for example a "logical 1", such as signal E66, this signal is also inverted by inverter 606. The E66 signal turns on FET 320 and at the output of inverter 606 a "logical 0" turns off FET 316. With FET 320 turned on, a conduction path through FET 320 is established, and no conduction path to ground is found through FET 316. As a result of the conduction path, the base voltages of transistor 314 and 318 are raised to voltage $V_{ADJI}$. This provides the bias voltage $V_{ADJI}$ for transistor 314 and 318 turning them on. Signal EN1 is applied to the gates of transistor 540. This forms a conduction path through transistor 540. This provides the bias voltages $V_{ADJI}$ for the transistors 211, 218, 322 and 312 turning them on. Thus, since the voltage $V_{ADJI}$ is applied to the bases of transistors 312 and through 322, a conduction path exists through transistor 312 and 322. These conduction paths act as current sources. Thus, there are two current paths on each side of capacitors 306 and 308. On one side, there is a first conduction path through transistor 322 and a second conductor path through transistor 318 and on the other side of capacitors 306 and 308; there is a third conduction path through transistor 312 and a fourth conduction path through transistor 314. Thus, the signal E66 causes two conduction paths, on each side of the capacitors to be established. These two conduction paths allow double the current to flow from the capacitors to ground. This, in turn, doubles the slew rate of the ramp generator 804, since the capacitors integrate the applied differential voltage. When a pulse is applied to these capacitors through in2 and in2b, this pulse is integrated to generate the ramp. Thus, these elements form the basic operation of the ramp generator.

In contrast, if the voltage E66 is low, the output of inverter 606 is high. FET 316 is on as a result of the high signal from the output of the inverter 606, to establish a conduction path through FET 316, and FET 320 is off as a result of a logic low at E66. Thus, the bases of transistor 314 and 318 are at ground potential since a conduction path to ground has been established through transistor 316. This turns off transistors 318 or 314, and consequently only one current path exists on each side of capacitors 306 and 308 namely through transistors 312 and 322. The signal E66 hence controls the number of charging and discharging current paths through capacitors 308 and 306. A plurality of varying voltages could control a plurality of current paths, allowing the slew rate to be varied accordingly.

Likewise, for signal E33, when this signal is high, FET 212 is on, creating a conducting path through FET 212, and FET 216 is off, creating no conducting path through FET 216. This raises the voltage at the bases of transistor 210 and 214 to voltage $V_{ADJI}$ to provide the bias for these transistors. Consequently, transistors 211 and 210 and transistor 214 and transistor 218 are in a conduction state, creating a current source through each of the respective transistors. A first current source exists through transistor 211 and a second current source through 210. Likewise, on the other side of capacitors 204 and 206, a third current source exists through transistor 214, and a fourth current source exists through transistor 218.

A current source exists through transistor 214, and a fourth current source exists through transistor 218.

The inputs in2 and in2b are a pair of differential signals of swing 2ΔV. This comes from one of the clock phase outputs from the ring oscillator VCO. The node E21 will follow in2 minus a diode drop due to emitter follower action if transistor 300 is on. In the same fashion, node E21b will follow in2b minus a diode drop if transistor 334 is on.

Without lost of generality, assume upon startup in2 is lower than in2b by ΔV. A potential difference of ΔV is established between the capacitors 306 and 308 as both transistors 300 and 334 are on and, $$(in2b-in2)=(E21b-621)=\Delta V$$

Now if a step input of $2\Delta V$ is applied to in2 and in2b, (in2−in2b) becomes $\Delta V$, and transistor 300 is on. Node 621 will acquire the voltage of in2 minus a diode drop and goes up by $\Delta V$. Because the voltage across the capacitor cannot change instantaneously due to the stored charge, node E21b will follow node E21 and goes up by $\Delta V$. As $\Delta V$ is more than 300 mV, this will turn off transistor 334. The voltage across the capacitor 306 and 308 will be discharged by the current source provided by transistor 312 and resistor 332. and through the transistor 300 to supply. If the E66 is high the extra current sources provides by transistor 314 and resistor 330 will be enabled, doubling the discharging current. This process continues until node E21b reaches the voltage of node E21 minus $\Delta V$. In this instant, transistor 334 starts to turn on and clamps node E21b at in2b minus a diode drop which is the same as node E21 minus $\Delta V$. Node E21 stays at the voltage of in2 minus a diode drop. The differential voltage of (E21–E21b) is therefore a ramp as shown in FIG. 10. The stew rate of the ramp is controlled depending on how many current sources are enabled.

Since the input to in2 and in2b is a differential clock, a step of opposite polarity and magnitude $2\Delta V$ will eventually arrive. In this case, the exact sequence or events will occur again but in the opposite polarity.

Now the step input of $-2\Delta V$ is applied to in2 and in2b, (in2−in2b) becomes $-\Delta V$, and transistor 334 is on. Node E21b will acquire the voltage of in2b minus a diode drop and goes up by $\Delta V$. Because the voltage across the capacitor cannot change instantaneously due to the stored charge, node E21 will follow node E21b and goes up by $\Delta V$. As $\Delta V$ is more than 300 mV, this will turn off transistor 300. The voltage across the capacitor 306 and 308 will be discharged by the current source provided by transistor 322 and resistor 326, and through the transistor 334 to supply. If the E66 is high, the extra current sources provided by transistor 318 and resistor 321 will be enabled, doubling the discharging current. This process continues until node E21 reaches the voltage of node E21b minus $\Delta V$. In this instant, transistor 300 starts to turn on and clamps node E21 at in2 minus a diode drop, which is the same as node E21b minus $\Delta V$. Node E21b stays at the voltage of in2b minus a diode drop. The differential voltage of (E21b–E21) is therefore a ramp as shown in FIG. 11. The slew rate of the ramp is controlled depending on how many current sources are enabled.

The first ramp generator 808 operates on the same principle. The inputs in1 and in1b are a pair of differential signal of swing $2\Delta V$. This is one of the clock phase outputs from the ring oscillator VCO. The node E11 will follow in1 minus a diode drop due to emitter follower action if transistor 224 is on. In the same fashion, node E11b will follow in1b minus a diode drop if transistor 220 is on.

Without lost of generality, assume upon startup in1 is lower than in1b by $\Delta V$. A potential difference of $\Delta V$ is established between the capacitors 206 and 204 as both transistors 224 and 220 are on and, $$(in1b-in1)=(E11b-E11)=\Delta V$$

Now if a step input of $2\Delta V$ is applied to in1 and in1b, (in1−in1b) becomes $\Delta V$ and transistor 224 is on. Node E11 will acquire the voltage of in1 minus a diode drop and goes up by $\Delta V$. Because the voltage across the capacitor cannot change instantaneously due to the stored charge. Node E11b will follow node E11 and goes up by $\Delta V$. As $\Delta V$ is more than 300 mV, this will turn off transistor 220. The voltage across the capacitor 206 and 204 will be discharged by the current source provided by transistor 218 and resistor 231, and through the transistor 224 to supply. If the E33 is high, the extra current sources provided by transistor 214 and resistor 232 will be enabled, doubling the discharging current. This process continues until node E11b reaches the voltage of node E11 minus $\Delta V$. In this instant, transistor 220 starts to turn on and clamps node E11b at in1b minus a diode drop which is the same as node E11 minus $\Delta V$. Node E11 stays at the voltage of in1 minus a diode drop. The differential voltage of (E11–E11b) is therefore a ramp as shown in FIG. 12. The slew rate of the ramp is controlled depending on how many current sources are enabled.

Since the input to in1 and in1b is a differential clock, a step of opposite polarity and magnitude $2\Delta V$ will eventually arrive. In this case the exact sequence of events will occur again but in opposite polarity.

Now the step input of $-2\Delta V$ is applied to in1 and in1b, (in1−in1b) becomes $-\Delta V$ and transistor 220 is on. Node E11b will acquire the voltage of in1b minus a diode drop and goes up by $\Delta V$. Because the voltage across the capacitor cannot change instantaneously due to the stored charge, node E11 will follow node E11b and goes up by $\Delta V$. As $\Delta V$ is more than 300 mV, this will turn off transistor 224. The voltage across the capacitor 206 and 204 will be discharged by the current source provided by transistor 211 and resistor 226, and through the transistor 220 to supply. If the E33 is high, the extra current sources provided by transistor 210 and resistor 228 will be enabled, doubling the discharging current. This process continues until node E11 reaches the voltage of node E11b minus $\Delta V$. In this instant, transistor 224 starts to turn on and clamps node E11 at in1 minus a diode drop which is the same as node E11b minus $\Delta V$. Node E11b stays at the voltage of in1b minus a diode drop. The differential voltage of (E11b–E11) is therefore a ramp as shown in FIG. 12. The slew rate of the ramp is controlled depending on how many current sources are enabled.

The transistors 302 and 304 and resistors 307 and 309 implements an emitter degenerated amplifier to buffer the ramp generator 804 outputs and converts it to current before feeding it to the summing resistors 100 and 102. Likewise, the transistors 202 and 200 and resistors 203 and 209 implements an emitter degenerated amplifier to buffer the ramp generator 808 outputs and convert it to current before feeding it to the summing resistors 100 and 102.

The outputs of the summing resistors sum and sumb are buffered with transistors 400 and 402 acting as emitter follower amplifiers before feeding to the differential comparator 816. The differential comparator 816 compares the voltages at nodes e3 and e3b by the differential pair implemented by the transistors 404 and 406 and resistors 440 and 442. This converts the zero crossing point of the differential voltage (e3−e3b) to a differential logic transition edge at the outputs of the comparator 450 and 452.

The slew rate of the two ramp generators is controlled by the two logic signal E33 and E66. These two signals in turn is defined by the two logic inputs EN_P5 and EN_P33. When EN_P5 is a logic high, regardless of the state of EN_P33, both E33 and E66 will be a logic high because of the OR logic function. Hence both ramp generator will be operating in the 2X slew rate mode. The circuit now is a 2X phase interpolator and is intended to use as a test mode or for backward compatibility. For normal 3X phase interpolation operation, EN_P5 is a Logic low.

When EN_P5 is a logic low and EN_P33 is a logic high, E66 will be a logic low, and E33 will be a logic high. The ramp generator 808 will then operate in the 2X slew rate mode, and the ramp generator 804 will operate in the 1X slew rate mode. The ⅓ phase (first interpolated phase) will be generated at the output.

When EN_P5 is a logic low and EN_P33 is a logic low, E33 will be a logic low and E66 will be a logic high. The ramp generator 808 will then operate in the 1X slew rate mode, and ramp generator 804 will operate in the 2X slew rate mode. The ⅔ phase (second interpolated phase) will be generated at the output.

Figure 9:
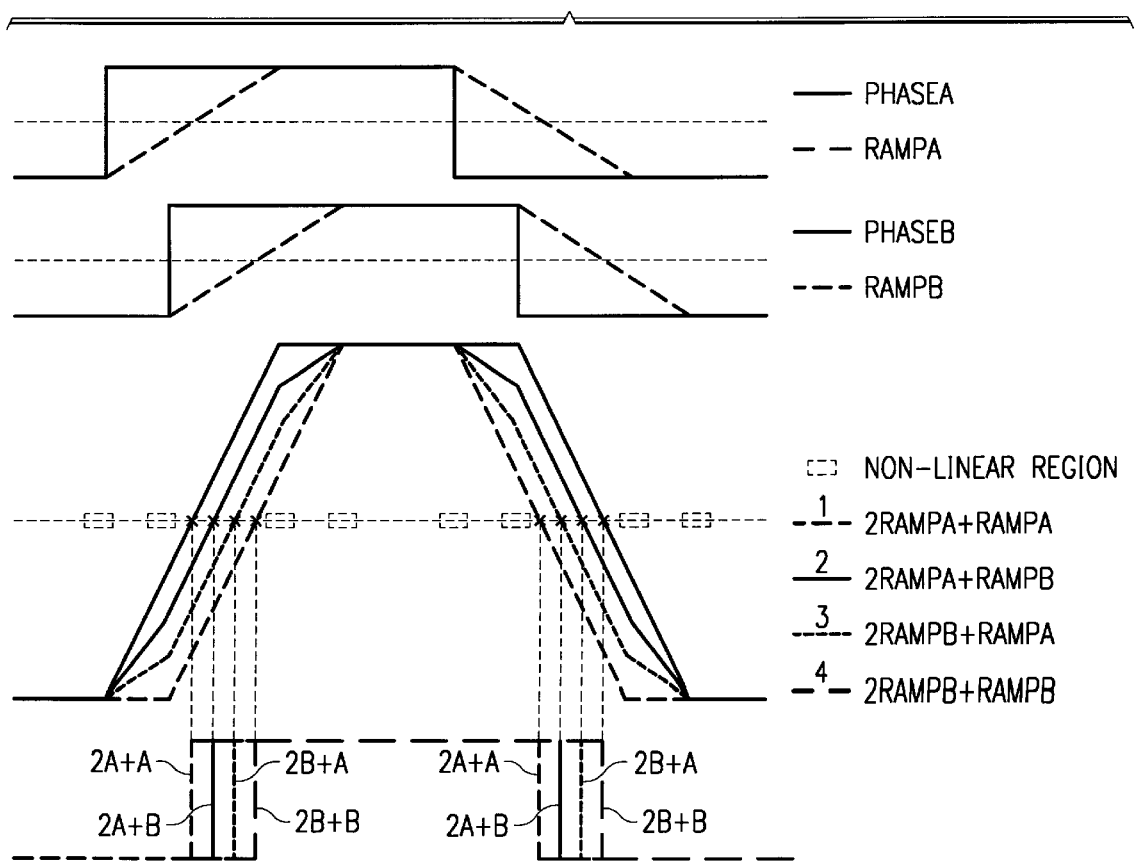
FIG. 9 illustrates waveform diagram of the 2 A+B interpolator (3X phase) circuit.

FIG. 9 illustrates two phases, namely phase A and phase B, representing two adjacent phases from the ring oscillator. With a 6 stage ring oscillator, phase A and phase B are normally 30° or 1/12 of a VCO period apart. The first and second ramp generator 804 and 808 generate ramp A and ramp B from phase A and phase B respectively, as illustrated at the top of FIG. 9. Depending on the gain or slew rate of the respective ramp generator, either trace 2 (2 Ramp A+Ramp B) or trace 3 (2 Ramp B+Ramp A) will be generated. If we input phase A or phase B only to both of the first and second ramp generators 804 and 808, trace 1 (2 Ramp A+Ramp A) and trace 4 (2 Ramp B+Ramp B) will be obtained, respectively. It is illustrated that the zero crossing point of the four traces are separated from each other by ⅓ of the phase difference between phase A and phase B (10° or 1/36 of the VCO period). Thus, the zero-crossing point of the summation of the two ramps, gives the desired phase interpretation location. The differential comparator 816 converts this zero-crossing point to the specific clock phase that can be used in data writing process as shown as the bottom group of signals in FIG. 9. The output of the summation circuit 814 of the ramp generators 804 and 808 is non-linear in transition points when the ramp generators receives its input steps. It is desirable to direct these non-linear regions as far as possible from the zero-crossing points to provide a more accurate interpolation. It can be seen that the present invention achieves this and provides the comparator 816 an extremely sharp ramp for comparison. The location of these non-linear regions and their distance from the zero-crossing point depends on the ramp duration and the frequency of operation. The longer the ramp duration, the further away these non-linear regions are from the zero-crossing point with respect to time. A limit on the ramp duration is half the period of the clock. If the ramp duration exceeds this limit, the ramp will transition from ramping up to ramping down before reaching its boundary values. Thus, the circuit will provide inconsistent results as a result of inconsistent initial conditions on the capacitors 204/206 and 306/308 during each cycle. As illustrated in FIG. 9, the ramp duration is set to ¼ of the period of the clock. However, the ramp duration could easily be set to ⅓ of the clock period. The duration of the ramp needs to be closely related to the clock period and the frequency of operation. This is achieved using the voltage $V_{ADJ}$ as the bias voltage for the first and second ramp generators 804 and 808. This same voltage $V_{ADJ}$ bias voltage is used in the ring oscillator to define the oscillation frequency and period to ensure good tracking between the ramp duration and the period of the clock. Thus, the ramp duration typically is less than half the period to ensure that there is sufficient guard band for circuit mismatches and environmental gradients.

We claim:

1. A phase interpolation circuit to provide a phase interpolation signal, comprising:
    a circuit to generate a first phase signal and a second phase signal;
    a control circuit to generate a control signal;
    a first programmable ramp generator to receive the first phase signal and to alternatively generate either a first phase interpolation signal or a second phase interpolation signal based on said control signal;
    a second programmable ramp generator to receive the second phase signal and to alternatively generate either a third phase interpolation signal or a fourth phase interpolation signal based on said control signal;
    a summation circuit to sum either said first phase interpolation signal or said second phase interpolation signal with said third phase interpolation signal or said fourth phase interpolation signal to output a summation signal;
    a precompensation circuit to generate a precompensation signal based on said summation signal.

2. A phase interpolation circuit to provide a phase interpolation signal as in claim 1, wherein,
    said first programmable ramp generator generates either said first phase interpolation signal or said second phase interpolation signal based on changing the slew rate of said first programmable ramp generator.

3. A phase interpolation circuit to provide a phase interpolation signal as in claim 2, wherein,
    said slew rate is changed by changing the current path of said first programmable ramp generator.

4. A phase interpolation circuit to provide a phase interpolation signal as in claim 1, wherein,
    said second programmable ramp generator generates either said third phase interpolation signal or said fourth phase interpolation signal based on changing the slew rate of said second programmable ramp generator.

5. A phase interpolation circuit to provide a phase interpolation signal as in claim 4, wherein
    said slew rate is changed by changing the current path of said second programmable ramp generator.

6. A system for precompensation comprising;
    an oscillator circuit to generate a plurality of phase signals,
    a multiplex circuit to select a first phase signal and a second phase signal from said plurality of phase signals;
    a control circuit to generate a control signal;
    a first programmable ramp generator to receive the first phase signal and to alternatively generate either a first phase interpolation signal or a second phase interpolation signal based on said control signal;
    a second programmable ramp generator to receive the second phase signal and to alternatively generate either a third phase interpolation signal or a fourth phase interpolation signal based on said control signal;
    a summation circuit to sum either said first phase interpolation signal or said second phase interpolation signal with said third phase interpolation signal or said fourth phase interpolation signal to output a summation signal;
    a precompensation circuit to generate a precompensation signal based on said summation signal.

7. A system for precompensation as in claim 6, wherein,
    said first programmable ramp generator generates either said first phase interpolation signal or said second phase interpolation signal based on changing the slew rate of said first programmable ramp generator.

8. A system for precompensation as in claim 7, wherein,
    said slew rate is changed by changing the current path of said first programmable ramp generator.

9. A system for precompensation as in claim 6, wherein, said second programmable ramp generator generates either said third phase interpolation signal or said fourth phase interpolation signal based on changing the slew rate of said second programmable ramp generator.

10. A system for precompensation signal as in claim 9, wherein said slew rate is changed by changing the current path of said second programmable ramp generator.

11. A method to provide a phase interpolation signal, comprising the steps of:

generating a first phase signal and a second phase signal;

generating a control signal;

receiving the first phase signal and alternatively generating either a first phase interpolation signal or a second phase interpolation signal based on said control signal;

receiving the second phase signal and alternatively generating either a third phase interpolation signal or a fourth phase interpolation signal based on said control signal;

summing either said first phase interpolation signal or said second phase interpolation signal with said third phase interpolation signal or said fourth phase interpolation signal to output a summation signal;

generating a precompensation signal based on said summation signal.

12. A method to provide a phase interpolation signal as in claim 11, wherein the method, generates either said first phase interpolation signal or said second phase interpolation signal based on changing the slew rate of a programmable ramp generator.

13. A method to provide a phase interpolation signal as in claim 11, wherein the method, generates either said third phase interpolation signal or said fourth phase interpolation signal based on changing the slew rate of a programmable ramp generator.

* * * * *